(12) United States Patent
Speich

(10) Patent No.: US 8,844,828 B2
(45) Date of Patent: Sep. 30, 2014

(54) RFID TRANSPONDER CHIP MODULE WITH CONNECTING MEANS FOR AN ANTENNA, TEXTILE TAG WITH AN RFID TRANSPONDER CHIP

(75) Inventor: Francisco Speich, Gipf-Oberfrick (CH)

(73) Assignee: Textilma AG (CH)

( * ) Notice: Subject to any disclaimer, the term of this patent is extended or adjusted under 35 U.S.C. 154(b) by 991 days.

(21) Appl. No.: 12/452,409

(22) PCT Filed: Jun. 25, 2008

(86) PCT No.: PCT/CH2008/000286
§ 371 (c)(1),
(2), (4) Date: Dec. 29, 2009

(87) PCT Pub. No.: WO2009/003299
PCT Pub. Date: Jan. 8, 2009

(65) Prior Publication Data
US 2010/0181382 A1    Jul. 22, 2010

(30) Foreign Application Priority Data
Jul. 3, 2007    (CH) ........................................ 1066/07

(51) Int. Cl.
*G06K 19/06* (2006.01)
*G06K 19/077* (2006.01)
*G06K 19/02* (2006.01)

(52) U.S. Cl.
CPC ........ *G06K 19/07745* (2013.01); *G06K 19/027* (2013.01); *G06K 19/07749* (2013.01); *G06K 19/07752* (2013.01)
USPC ........................................................ 235/492

(58) Field of Classification Search
USPC ........................................................ 235/492
See application file for complete search history.

(56) References Cited

U.S. PATENT DOCUMENTS

| | | | |
|---|---|---|---|
| 5,175,424 A * | 12/1992 | Lisimaque | 235/492 |
| 6,191,951 B1 | 2/2001 | Houdeau et al. | |
| 6,786,419 B2 * | 9/2004 | Kayanakis | 235/492 |
| 7,740,180 B2 * | 6/2010 | Ayala et al. | 235/492 |
| 2004/0244865 A1 * | 12/2004 | Jung et al. | 139/426 R |
| 2007/0251207 A1 | 11/2007 | Stobbe | |
| 2008/0191944 A1 | 8/2008 | Brod | |

FOREIGN PATENT DOCUMENTS

| | | |
|---|---|---|
| DE | 196 18 103 A1 | 11/1997 |
| DE | 197 08 617 A1 | 10/1998 |
| DE | 101 55 935 A1 | 5/2003 |
| DE | 10 2005 016 930 A1 | 9/2006 |
| DE | 10 2006 011 596 A1 | 9/2007 |
| WO | WO 97/42658 | 11/1997 |
| WO | WO 2005/071605 A2 | 8/2005 |
| WO | WO 2007/104634 A1 | 9/2007 |

* cited by examiner

*Primary Examiner* — Jamara Franklin
(74) *Attorney, Agent, or Firm* — George Pappas

(57) ABSTRACT

To be able to connect an RFID transponder chip module which has not only a transponder chip but also conductive, preferably metal or metallized connection feet, as easily as possible and particularly without the risk of soiling to the antenna wires of a tag strip, which are fitted in or on a textile material, the connection feet of the transponder chip module are designed with an activatable connecting for electrical and mechanical connection to the antenna wires. The connecting feet are in the form of strip-like extension elements on both sides of the RFID transponder chip, wherein the connection feet are respectively arranged at that end of the extension elements which is remote from the RFID transponder chip. The connection feet are formed with an activatable connecting for the purpose of electrical and mechanical connection to the electrical conductors.

19 Claims, 3 Drawing Sheets

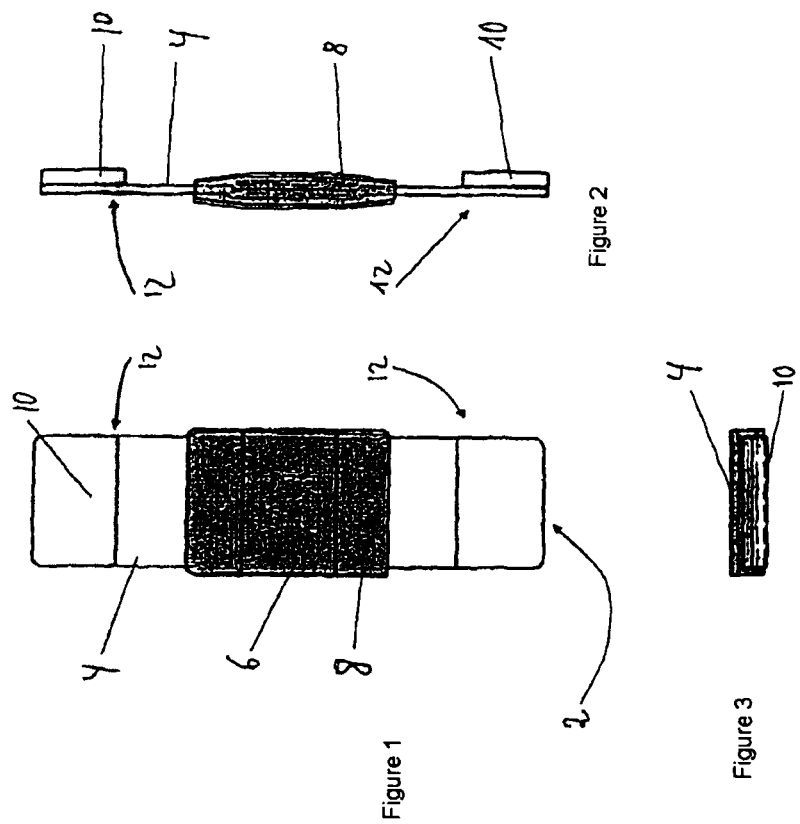

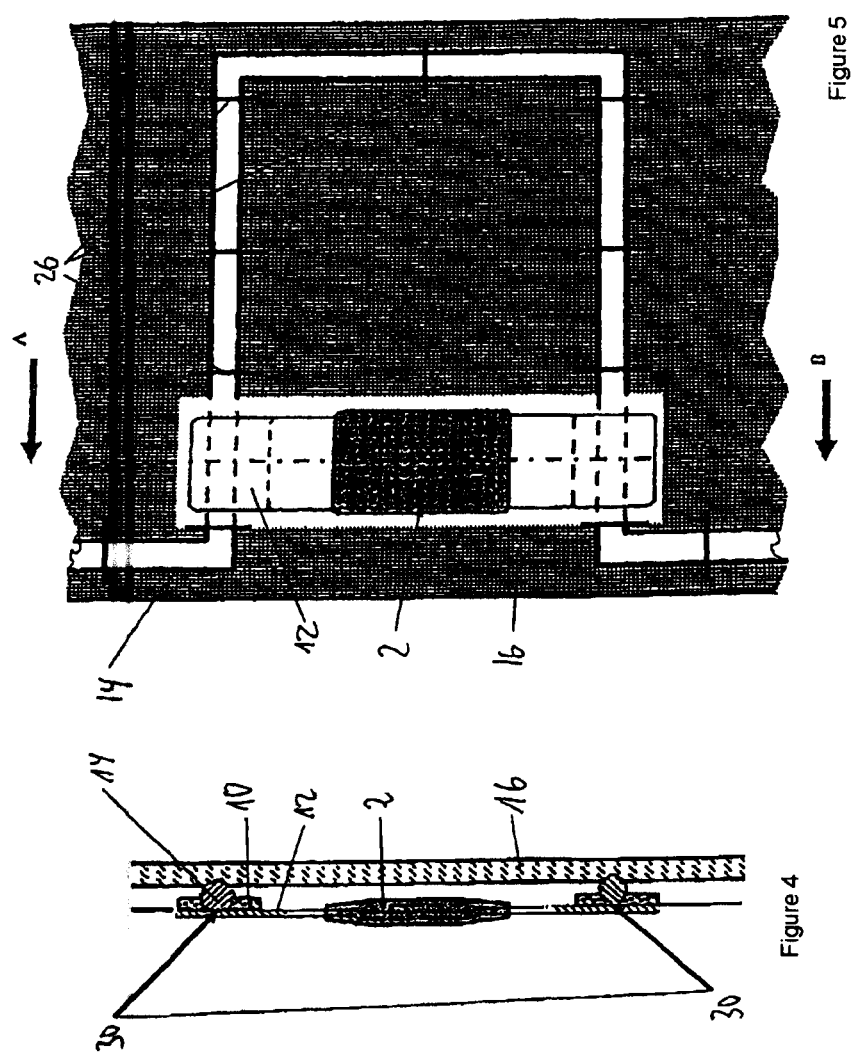

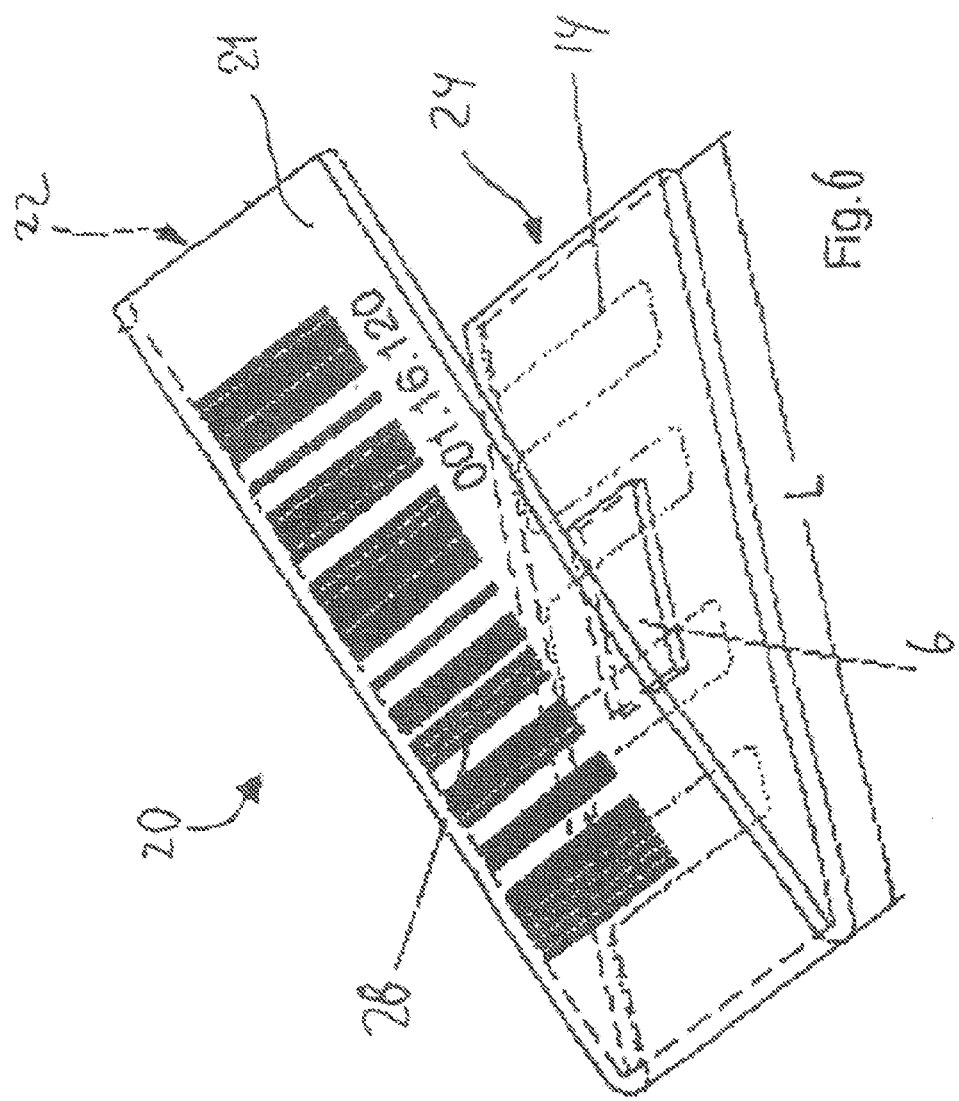

RFID TRANSPONDER CHIP MODULE WITH CONNECTING MEANS FOR AN ANTENNA, TEXTILE TAG WITH AN RFID TRANSPONDER CHIP

This application claims priority of PCT application PCT/CH2008/000286 having a priority date of Jun. 3, 2007, the disclosure of which is incorporated herein by reference.

TECHNICAL FIELD

The invention relates to an RFID transponder chip module with an IC chip, to a textile tag with an RFID transponder chip module and to the use of an RFID transponder chip module.

BACKGROUND OF THE INVENTION

It is known practice to produce transponders in which a chip is connected to an antenna which is incorporated in a textile material. In this case, connection lugs are connected to antenna sections. This arrangement of the chips on the antennas and the connection thereof gives rise to difficulties.

WO 2005/071605 discloses a method for electrically connecting an RFID transponder chip to an antenna filament which is connected to a textile fabric. A solution to the problem described above is not described in detail for this method. Only different types of connection such as bonding, welding, soldering, which obviously need to be performed in situ, are mentioned. These connection methods are not only complicated but also, in particular, associated with soiling of the textile material.

DE 101 55 935 A1 discloses a tag with a textile support which has a flexible electrical conductor with a point of connection for an electronic component. DE 101 55 935 A1 proposes contact connection of the transponder IC to wire ends by imprinting preferably the contact areas of the transponder IC with a low melt solder paste. The concept of DE 101 55 935 A1 thus provides for the contact areas of the IC to be regarded as interfaces for producing the tag. The concept disclosed in DE 101 55 935 A1 has been found to be disadvantageous when a textile tag is to be fitted with a transponder chip module in which antenna filaments are woven or knitted, for example, since the woven-in or knitted-in antenna filaments do not have the fixing dimensions of the transponder ICs.

WO 2005/011605 A1 discloses a textile material which has a transponder chip which is attached and electrically connected—by means of its contact areas—to an antenna wire. The solution in WO 2005/011605 A1 provides for the antenna wire to be in meandrous form, with a longitudinal limb of the antenna wire being separated such that the ends are positioned on the contact areas of the transponder IC and can be connected thereto. In this respect, the solution in WO 2005/011605 A1 is identical to the solution in DE 101 55 935 A1 and is affected by the same drawbacks.

DE 196 18 103 A1 discloses a—nontextile—chip card module in which provision is made for a metal support layer to be connected to the transponder chip by means of bonding wires. What may be suitable for a chip card module is very disadvantageous for a textile module, since appropriate processing is not possible and the antenna is also not available as a metal layer.

DE 197 08 617 A1 discloses a module which provides an IC in a connection frame so that the is intended to be bonded to a chip card—but in electrically nonconductive fashion, which would also not make sense in the application of a chip card.

SUMMARY OF THE INVENTION

It is an object of the invention to specify an RFID transponder chip module which can easily be connected to an antenna which is arranged in a textile material. In this case, the transponder chip module is intended to be provided with an RFID transponder chip and to have conductive, preferably metal or metalized, connection feet for connection to electrical conductors, particularly textile material which has antenna wires.

The prior art is overcome by virtue of the transponder chip module no longer being identical to the IC itself. According to the invention, the connection feet are in the form of strip-like extension elements on both sides of the RFID transponder chip, which allows arrangement between the transverse limbs of a meandrous—for example—antenna without the need—as in the prior art—for a longitudinal limb of the antenna wire to be separated precisely at the points of connection of the transponder chip, so that the ends can be positioned on and connected to the contact areas of the transponder IC. The connection feet are respectively arranged at that end of the extension elements which is remote from the RFID transponder chip, which allows arrangement of the module and connection thereof to the transverse limbs—for example—of a meandrously woven-in or knitted-in antenna filament. The metalized connection feet are produced with an activatable connecting means for the purpose of electrical and mechanical connection to the electrical conductors.

The fact that the metalized connection feet of the transponder chip module are produced with an activatable connecting means for the purpose of electrical and mechanical connection to the electrical conductors means that the production process for a textile tag is particularly simple, since the connecting means can easily be put onto the connection feet of the transponder chip module in prefabricated fashion in a very precisely metered quantity and form regardless of the connection process. At the point of connection, the connecting means can be activated using simple tools and without renewed supply of connecting means and/or flux. The simple activation process, e.g. by heating, and the precise metering of the connecting means ensure a simple connection and avoid the risk of soiling through excess connection means and/or flux.

It is particularly advantageous if the connecting means used is soft solder or a conductive adhesive and is already present in precisely the correct quantity on the metalized connection feet. The strip-like extension elements for the transponder chip module may advantageously be composed of plastic. Those portions of the strip-like extension elements which face the RFID transponder chip are advantageous in the form of a connection frame for the RFID transponder chip and thus provide the chip with mechanical protection.

To be able to produce a textile tag with an RFID transponder chip of this kind and a textile material which has conductor wires, particularly antenna wires, it is advantageous if the electrical conductors have means which inhibit oxide formation or have an electroplated surface. An advantage in this context is coating materials such as silver, gold or bismuth/tin alloy.

A refinement of a textile tag is particularly advantageous if the electrical conductors are produced with a plastic layer on their surface, wherein the plastic layer adapts to the connecting means to promote connection.

In principle, it is proposed that the RFID transponder chip modules described above are intended to be used to produce textile tags. Alternatively, it is also advantageous to use—typically larger-area—textile printed circuit boards.

The aforementioned and the claimed elements to be used in line with the invention which are described in the exemplary embodiments below are not subject to any particular exception conditions in terms of their size, shaping, material use and their technical design, which means that the selection criteria known in a respective field of application can be applied without restriction.

BRIEF DESCRIPTION OF THE DRAWINGS

Exemplary embodiments of the invention are described in more detail below with reference to the drawings, in which:

FIG. 1 shows a plan view of a transponder chip module based on a preferred exemplary embodiment of the present invention;

FIG. 2 shows a side view of the transponder chip module shown in FIG. 1;

FIG. 3 shows a front view of the transponder chip module shown in FIG. 1;

FIG. 4 shows a side view of a transponder chip module shown in FIG. 1 which is arranged on a tag web;

FIG. 5 shows the plan view of the arrangement shown in FIG. 4; and

FIG. 6 shows a typical transponder tag with a transponder chip module.

DETAILED DESCRIPTION OF THE PREFERRED EMBODIMENTS

FIGS. 1 to 3 show a transponder chip module 2 which—in a later process—can be connected to an antenna which is connected to a textile material. In the preferred exemplary embodiment, the transponder chip module 2 comprises a supporting frame 4 ("Leadframe") on which a transponder chip 6 (IC chip) is arranged. In the present exemplary embodiment, the transponder chip 6 is overmolded to protect it. This overmolding ("molding") is denoted by 8 in FIGS. 1 to 3. In addition, two opposite sides of the transponder chip module 2 have electrical connection feet 12 to which—in line with the invention—activatable connecting means 10 are fitted in prefabricated fashion. In the present exemplary embodiment, these connecting means 10 are composed of soft solder, preferably composed of a tin alloy. Alternatively, the connecting means may also be composed of conductive plastic which—apart from a different melting point, at most—has similar properties to the soft solder. It is also alternatively possible to use a nonconductive plastic, in which case the connection foot to be put on needs to be put onto the antenna such that direct contact is produced which can no longer be insulated by the plastic, however. This is not necessary with a connecting means composed of soft solder or an electrically conductive plastic.

FIGS. 4 and 5 show the connection 30 of a transponder chip module 2 according to the preferred exemplary embodiment of the present invention to a tag web 16 which has an antenna wire 14 attached to it by means of technically typical, conventional connections 26, for example by means of weft and/or warp. The connection 30 is shown geometrically such that both soft solder and electrically conductive or even electrically nonconductive plastic is possible as connecting means 10, since the antenna wire 14 is in direct contact with the connection foot 12.

The main advantage of the connection shown here is that the connecting means 10 can be applied simply and precisely in the correct quantity. The fact that the connecting means 10 is already connected to the metalized connection feet 12 means that only a little or even no flux is required when the connection foot is soldered to the relevant antenna filament. This avoids the risk of soiling of the tag. In addition, the connection process can be carried out quickly, since it only needs to be performed on one side. Overall, the connection process is considerably simplified by the invention.

FIG. 6 shows a typical transponder tag 20 which has a textile web 21 which forms a top half 22 with a barcode 28 and a bottom half 24 with the electrical transponder chip 26 and the antenna 14.

The present exemplary embodiment is described such that the RFID transponder chip modules 2 are intended to be used to produce textile tags 30. An alternative use is also the use of—typically larger-area—textile printed circuit boards, however.

LIST OF REFERENCE SYMBOLS

2 Transponder chip module
4 Connection frame (Leadframe)
6 Transponder chip
8 Overmolding (Molding)
10 Connecting means
12 Connection feet
14 Antenna wire
16 Tag web
18 Transponder tag
20 Textile web
22 Top half
24 Bottom half
26 Connection of antenna wire/fabric
28 Barcode
30 Connection of transponder chip module to the antenna

The invention claimed is:

1. A system for attaching an RFID transponder chip to a textile web comprising:
    an antenna wire attached to said textile web;
    a transponder chip module comprising an RFID transponder chip, said module having a frame and conductive metal connection feet at remote ends of said RFID transponder chip, and further wherein said module comprises activatable connection means on said conductive connection feet for electrical and mechanical connection to electrical conductors; and,
    wherein said module connection feet are mechanically and electrically attached to said antenna wire after said antenna wire is attached to said textile web using said activatable connection means.

2. The system for attaching an RFID transponder chip to a textile web of claim 1 wherein said activatable connection means comprises a soft solder containing a tin bismuth alloy.

3. The system for attaching an RFID transponder chip to a textile web of claim 1 wherein said activatable connection means comprises a conductive adhesive.

4. The system for attaching an RFID transponder chip to a textile web of claim 1 wherein said antenna wire comprises means which inhibits oxide formation.

5. The system for attaching an RFID transponder chip to a textile web of claim 1 wherein said antenna wire comprises an electroplated surface material wherein said surface material is selected from one or more of silver, gold and a bismuth/tin alloy.

6. The system for attaching an RFID transponder chip to a textile web of claim 1 wherein said frame is made of plastic.

7. The system for attaching an RFID transponder chip to a textile web of claim 1 wherein said RFID transponder chip is overmolded onto said module frame.

8. The system for attaching an RFID transponder chip to a textile web of claim 1 wherein said antenna is attached to said textile web using weft or warp threads of said textile.

9. The system for attaching an RFID transponder chip to a textile web of claim 8 wherein said activatable connection means comprises a soft solder containing a tin bismuth alloy.

10. The system for attaching an RFID transponder chip to a textile web of claim 8 wherein said activatable connection means comprises a conductive adhesive.

11. The system for attaching an RFID transponder chip to a textile web of claim 8 wherein said antenna wire comprises means which inhibits oxide formation.

12. The system for attaching an RFID transponder chip to a textile web of claim 8 wherein said antenna wire comprises an electroplated surface material wherein said surface material is selected from one or more of silver, gold and a bismuth/tin alloy.

13. The system for attaching an RFID transponder chip to a textile web of claim 8 wherein said frame is made of plastic.

14. The system for attaching an RFID transponder chip to a textile web of claim 8 wherein said RFID transponder chip is overmolded onto said module frame.

15. The system for attaching an RFID transponder chip to a textile web of claim 14 wherein said activatable connection means comprises a soft solder containing a tin bismuth alloy.

16. The system for attaching an RFID transponder chip to a textile web of claim 14 wherein said activatable connection means comprises a conductive adhesive.

17. The system for attaching an RFID transponder chip to a textile web of claim 14 wherein said antenna wire comprises means which inhibits oxide formation.

18. The system for attaching an RFID transponder chip to a textile web of claim 14 wherein said antenna wire comprises an electroplated surface material wherein said surface material is selected from one or more of silver, gold and a bismuth/tin alloy.

19. The system for attaching an RFID transponder chip to a textile web of claim 14 wherein said frame is made of plastic.

* * * * *

UNITED STATES PATENT AND TRADEMARK OFFICE
CERTIFICATE OF CORRECTION

| | | |
|---|---|---|
| PATENT NO. | : 8,844,828 B2 | Page 1 of 1 |
| APPLICATION NO. | : 12/452409 | |
| DATED | : September 30, 2014 | |
| INVENTOR(S) | : Francisco Speich | |

It is certified that error appears in the above-identified patent and that said Letters Patent is hereby corrected as shown below:

Title page item (57)

In the Abstract, Line 7, change "connecting" to --connection--

In the Abstract, Lines 13-14, change "connecting" to --connection--

Signed and Sealed this
Twenty-third Day of December, 2014

Michelle K. Lee
*Deputy Director of the United States Patent and Trademark Office*